(12) United States Patent
Chang et al.

(10) Patent No.: US 8,703,576 B2
(45) Date of Patent: Apr. 22, 2014

(54) GAP-FILL KEYHOLE REPAIR USING PRINTABLE DIELECTRIC MATERIAL

(75) Inventors: Paul Chang, Mahopac, NY (US); Josephine B. Chang, Mahopac, NY (US); Michael A. Guillorn, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 338 days.

(21) Appl. No.: 13/232,293

(22) Filed: Sep. 14, 2011

(65) Prior Publication Data
US 2013/0062709 A1 Mar. 14, 2013

(51) Int. Cl.
*H01L 21/76* (2006.01)

(52) U.S. Cl.
USPC .............. 438/421; 438/422; 438/631

(58) Field of Classification Search
USPC .......................... 438/421, 422, 631
See application file for complete search history.

(56) References Cited

U.S. PATENT DOCUMENTS

| 6,207,546 | B1 * | 3/2001 | Chen et al. | 438/612 |
|---|---|---|---|---|
| 6,627,529 | B2 * | 9/2003 | Ireland | 438/619 |
| 2004/0229050 | A1 | 11/2004 | Li et al. | |

OTHER PUBLICATIONS

AW, K.C. et al., "Dual Model Describing Effects of Evaporated Metal Gate on Low-k Dielectric Methylsilsesquioxane in Metal Oxide Semiconductor Capacitor Structure" Semiconductor Physics, Quantum Electronics & Optoelectronics (Nov. 12, 2003) pp. 524-527, vol. 6, No. 4.

Ahner, N. et al., "Thermal Stability and Gap-Fill Properties of Spin-On MSQ Low-k Dielectrics" Microelectronic Engineering (Nov. 2007) pp. 2606-2609, vol. 84, No. 11.

* cited by examiner

*Primary Examiner* — Thien F Tran
(74) *Attorney, Agent, or Firm* — Scully, Scott, Murphy & Presser, P.C.; H. Daniel Schnurmann

(57) ABSTRACT

Disposable gate structures are formed on a semiconductor substrate. A planarization dielectric layer is deposited over the disposable gate structures and planarized to provide a top surface that is coplanar with top surface of the disposable gate structures. The planarization dielectric layer at this point includes gap-fill keyholes between narrowly spaced disposable gate structures. A printable dielectric layer is deposited over the planarization dielectric layer to fill the gap-fill keyholes. Areas of the printable dielectric layer over the gap-fill keyholes are illuminated with radiation that cross-links cross-linkable bonds in the material of the printable dielectric layer. Non-crosslinked portions of the printable dielectric layer are subsequently removed selective to crosslinked portions of the printable dielectric layer, which fills at least the upper portion of each gate-fill keyhole. The disposable gate structures are removed to form gate cavities. The gate cavities are filled with a gate dielectric and a gate electrode.

10 Claims, 13 Drawing Sheets

GAP-FILL KEYHOLE REPAIR USING PRINTABLE DIELECTRIC MATERIAL

BACKGROUND

The present disclosure relates to a method of manufacturing semiconductor structures, and particularly to a method of repairing gap-fill keyholes in a planarization dielectric layer, and structures formed thereby.

Planarization dielectric layers are employed in semiconductor manufacturing to provide a dielectric material structure having a planar top surface. Planarization dielectric layers can be employed for various purposes including, but not limited to, providing a dielectric template that embeds disposable material structures that are selectively removed and replaced with permanent structures. For example, in a replacement gate integration scheme, disposable gate structures can be formed on a semiconductor substrate, and a planarization dielectric layer can be formed thereupon. The planarization dielectric layer is subsequently planarized to provide a horizontal top surface that is coplanar with topmost surfaces of the disposable gate structures. The disposable gate structures are then removed selective to the planarization dielectric layer. Cavities in the disposable gate structures are filled with materials to form permanent structures, which are also referred to as replacement structures.

Dielectric materials that are deposited over protruding structures can have gap-fill keyholes. Gap-fill keyholes are generally formed between a pair of structures protruding above a substrate when the spacing between the pair is narrow and/or the sidewalls of the pair do not have a sufficient taper. A "gap-fill keyhole" refers to any cavity within a dielectric material layer that results from the inability of a deposition process that deposits the dielectric material layer to completely fill a space between two or more neighboring protruding structures that are present prior to deposition of the dielectric material layer.

Gap-fill keyholes function as a trap for materials deposited over the dielectric material layer, especially if the top of the gap-fill keyhole is exposed by recessing an initial top surface of the dielectric material layer. When a conductive material is deposited over the dielectric material layer, the conductive material can be deposited within the dielectric material layer to form a conductive channel that electrically shorts device components or blocks subsequent attempts to etch contact holes within the dielectric material layer.

BRIEF SUMMARY

Disposable gate structures are formed on a semiconductor substrate. A planarization dielectric layer is deposited over the disposable gate structures and planarized to provide a top surface that is coplanar with top surface of the disposable gate structures. The planarization dielectric layer at this point includes gap-fill keyholes between narrowly spaced disposable gate structures. A printable dielectric layer is deposited over the planarization dielectric layer to fill the gap-fill keyholes. Areas of the printable dielectric layer over the gap-fill keyholes are illuminated with radiation that cross-links cross-linkable bonds in the material of the printable dielectric layer. Non-crosslinked portions of the printable dielectric layer are subsequently removed selective to crosslinked portions of the printable dielectric layer, which fill at least the upper portion of each gate-fill keyhole. The disposable gate structures are removed to form gate cavities. The gate cavities are filled with a gate dielectric and a gate electrode.

According to an aspect of the present disclosure, a method of forming a structure is provided, which includes: forming protruding structures over a top surface of a substrate; forming a dielectric layer including a gap-fill keyhole on the substrate, wherein the dielectric layer is present between neighboring pairs of the protruding structures; applying a printable dielectric material layer over the dielectric layer, the printable dielectric material layer filling the gap-fill keyhole; lithographically exposing a portion of the printable dielectric material layer with radiation, wherein a crosslinked printable dielectric material portion is formed at least within an upper portion of the gap-fill keyhole; and removing non-crosslinked portions of the printable dielectric material layer from above the dielectric layer.

According to another aspect of the present disclosure, a structure including a dielectric layer located on a substrate is provided. A filled gap-fill keyhole is embedded in the dielectric layer. The filled gap-fill keyhole includes a crosslinked printable dielectric material portion having a top surface that is coplanar with a top surface of the dielectric layer.

BRIEF DESCRIPTION OF THE SEVERAL VIEWS OF THE DRAWINGS

In the present disclosure, drawings that are labeled with the same numeric label represent the same stage of a manufacturing process. Drawings that are labeled with the suffix "A" are top-down views. Drawings that are labeled with the suffix "B" are vertical cross-sectional views along a vertical plane B-B' in the top-down view labeled with the same numeric label and the suffix "A."

DETAILED DESCRIPTION

Figure 1A:
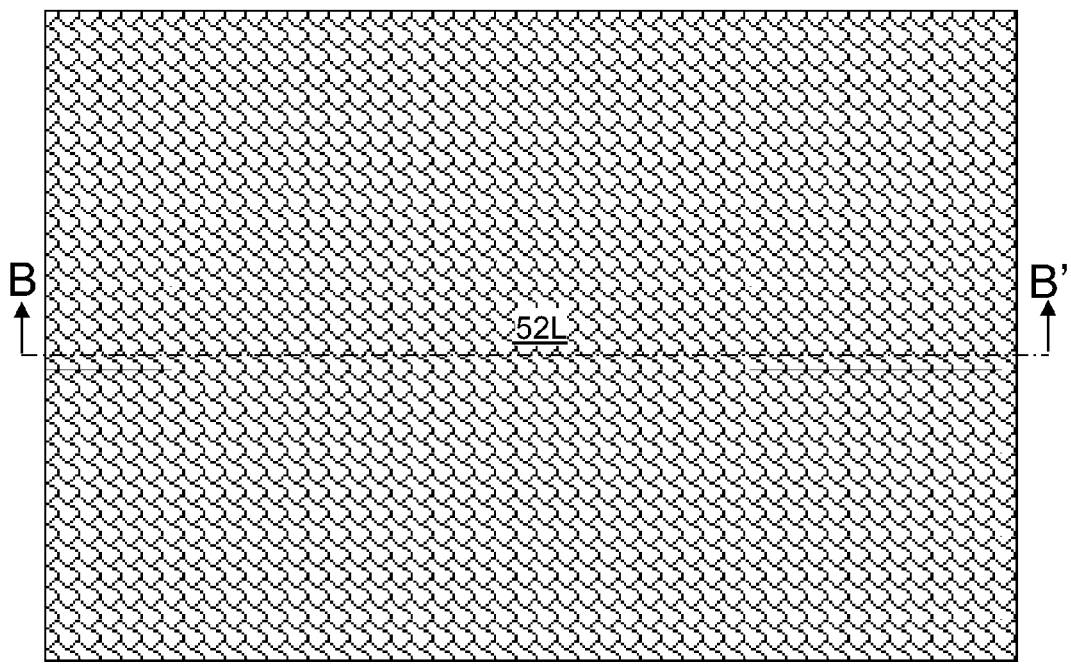
FIGS. 1A and 1B are views of an exemplary semiconductor structure after formation of disposable gate stack layers according to an embodiment of the present disclosure.

As stated above, the present disclosure relates to a method of repairing gap-fill keyholes in a planarization dielectric layer and structures formed thereby, which are now described in detail with accompanying figures. Like and corresponding elements mentioned herein and illustrated in the drawings are referred to by like reference numerals. The drawings are not necessarily drawn to scale.

Figure 1B:
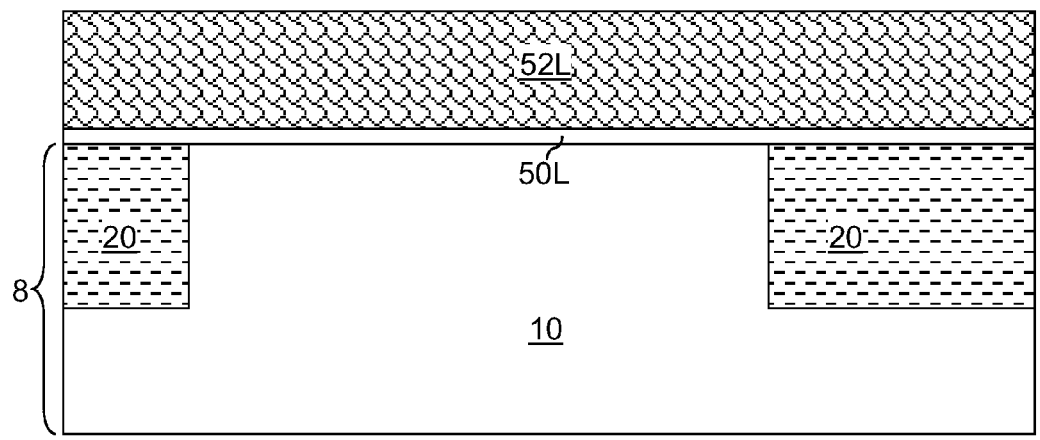

Referring to FIGS. 1A and 1B, an exemplary semiconductor structure according to an embodiment of the present disclosure includes a substrate 8 and material layers formed thereupon. The substrate 8 can be a semiconductor-on-insulator (SOI) substrate or a bulk semiconductor substrate. The substrate 8 includes a semiconductor region 10, which is a region of a single crystalline semiconductor material.

The semiconductor region 10 can be a top semiconductor layer of an SOI substrate or a bulk semiconductor substrate. The semiconductor region 10 can have a p-type doping or n-type doping, or can include an intrinsic semiconductor material. Shallow trench isolation structures 20 including a dielectric material can be formed in the substrate 8 to provide electrical isolation between neighboring semiconductor devices to be formed.

In one embodiment, the material layers can be disposable gate stack layers. The disposable gate stack layers can include a stack, from bottom to top, of a disposable gate dielectric layer 50L and a disposable gate material layer 52L. The disposable gate stack layers (50L, 52L) can be "blanket" layers, i.e., unpatterned planar layers, each having a uniform thickness throughout.

The disposable gate dielectric layer 50L includes a dielectric material, which can be silicon oxide, silicon nitride, silicon oxynitride, or a stack thereof. The thickness of the disposable gate dielectric layer 50L can be from 1 nm to 10 nm, although lesser and greater thicknesses can also be employed.

The disposable gate material layer 52L includes a disposable material, which can be a doped or undoped semiconductor material, a metallic material, a dielectric material, or a combination thereof. The disposable material is selected so that the disposable material can be removed while the material of a planarization dielectric layer (to be formed in a subsequent processing step) is not removed as will be described below. The disposable material of the disposable gate material layer 52L can be, for example, a doped or undoped, amorphous or polycrystalline, elemental or compound, semiconductor material, organosilicate glass, silicon oxide, silicon nitride, or a metallic material. The thickness of the disposable gate material layer 52L can be from 100 nm to 500 nm, although lesser and greater thicknesses can also be employed. The disposable gate material layer 52L can be deposited, for example, by chemical vapor deposition (CVD), physical vapor deposition (PVD), or a combination thereof.

Figure 2A:
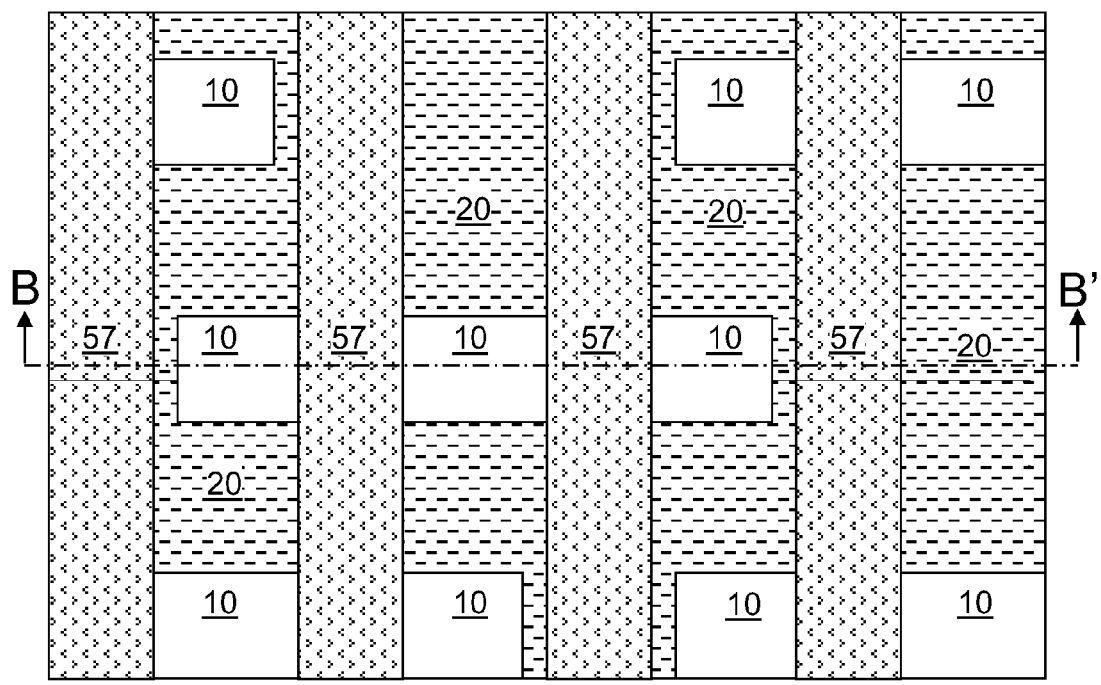
FIGS. 2A and 2B are views of the exemplary semiconductor structure after formation of disposable gate structures, which are protruding structures located above a top surface of a semiconductor substrate, according to an embodiment of the present disclosure.
Figure 2B:
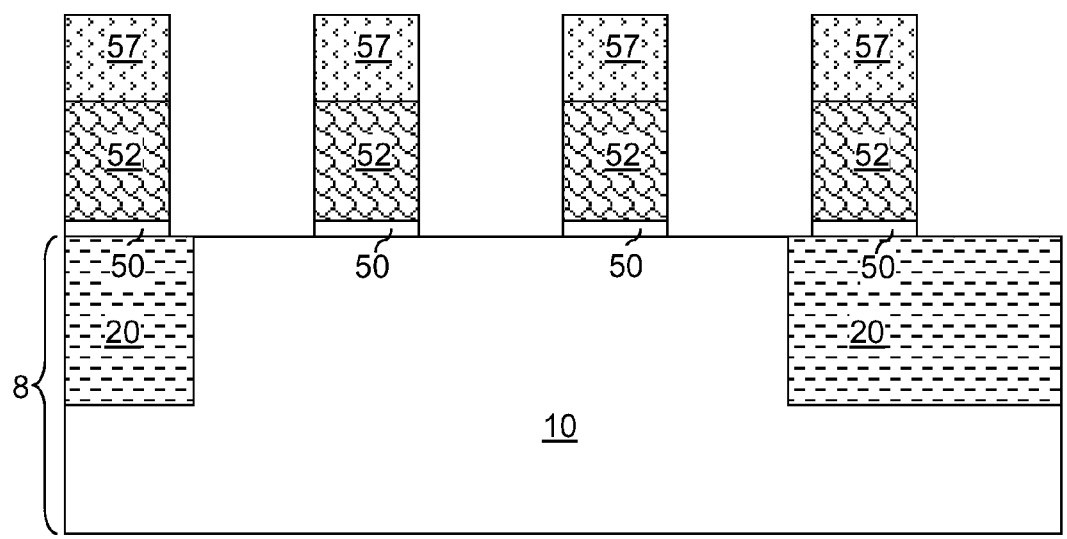

Referring to FIGS. 2A and 2B, protruding structures, i.e., structures that protrude above a planar top surface of the substrate 8, are formed on the substrate by patterning the material layers formed in the processing step of FIG. 1.

In one embodiment, the protruding structures are disposable gate structures that are formed by patterning the disposable gate stack layers (50L, 52L). Specifically, the disposable gate stack layers (50L, 52L) can be patterned by applying a photoresist 57 thereupon, lithographically developing the photoresist 57, developing the photoresist 57, and anisotropically etching physically exposed portions of the disposable gate stack layers (50L, 52L) employing the patterned photoresist 57 as an etch mask. The patterned photoresist 57 is subsequently removed, for example, by ashing.

The remaining portions of the disposable gate material layer 52L are disposable gate material portions 52. The remaining portions of the disposable gate dielectric layer 50L are disposable gate dielectrics 50. Each disposable gate structure (50, 52) includes a disposable gate material portion 52 and a disposable gate dielectric 50. The sidewalls of the disposable gate material portions 52 are vertically coincident, i.e., coincide in a top down view along a direction perpendicular to the top surface of the semiconductor substrate 8, with the sidewalls of the disposable gate dielectrics 50.

In one embodiment, the disposable gate structures (50, 52) can be formed as a one-dimensional array of lines having a uniform pitch therein. Further, the disposable gate structures (50, 52) can have the same width (i.e., the dimension between opposing sidewalls in a disposable gate structure) along the direction of the periodicity of the array (e.g., along the horizontal direction of the B-B' plane in FIG. 2A).

In another embodiment, the disposable gate structures (50, 52) may be formed without periodicity to include random shapes in a top-down view.

Figure 3A:
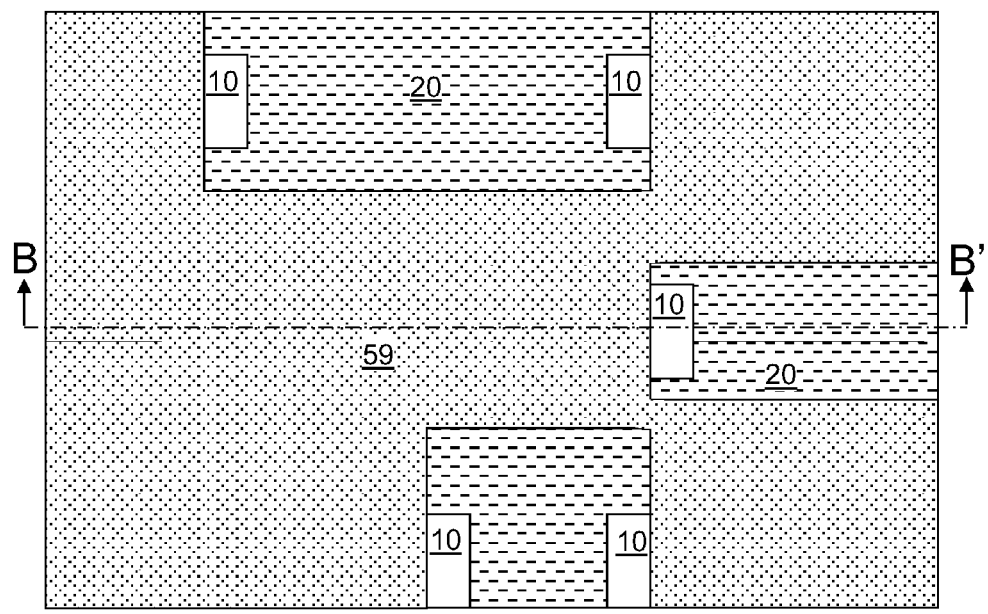
FIGS. 3A and 3B are view of the exemplary semiconductor structure after optional additional patterning of the disposable gate structures according to an embodiment of the present disclosure.
Figure 3B:
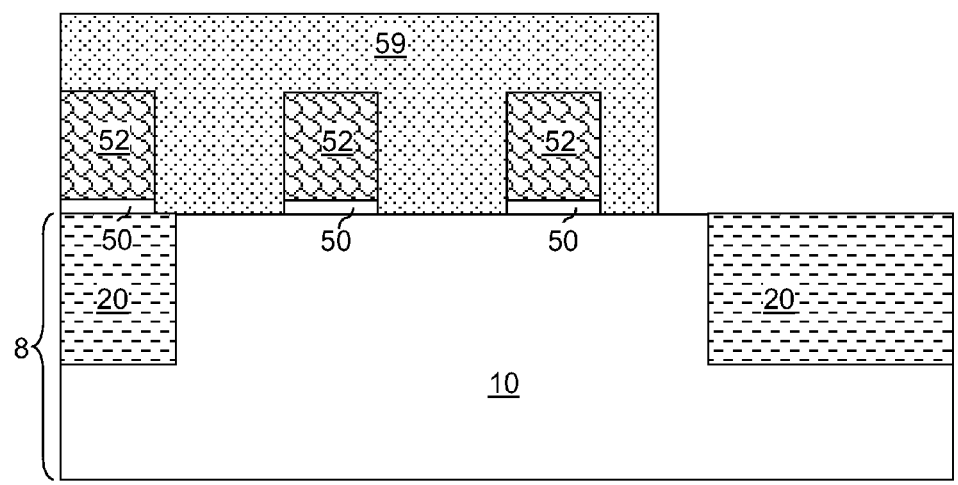

Referring to FIGS. 3A and 3B, additional patterning of the disposable gate structures (50, 52) can be optionally performed, for example, by applying another photoresist 59 over the substrate 8 and the disposable gate structures (50, 52), lithographically exposing the photoresist 59, developing the photoresist 59, and removing the physically exposed portions of the disposable gate structures (50, 52) selective to the semiconductor region 10 and the shallow trench isolation structures 20.

Figure 4A:
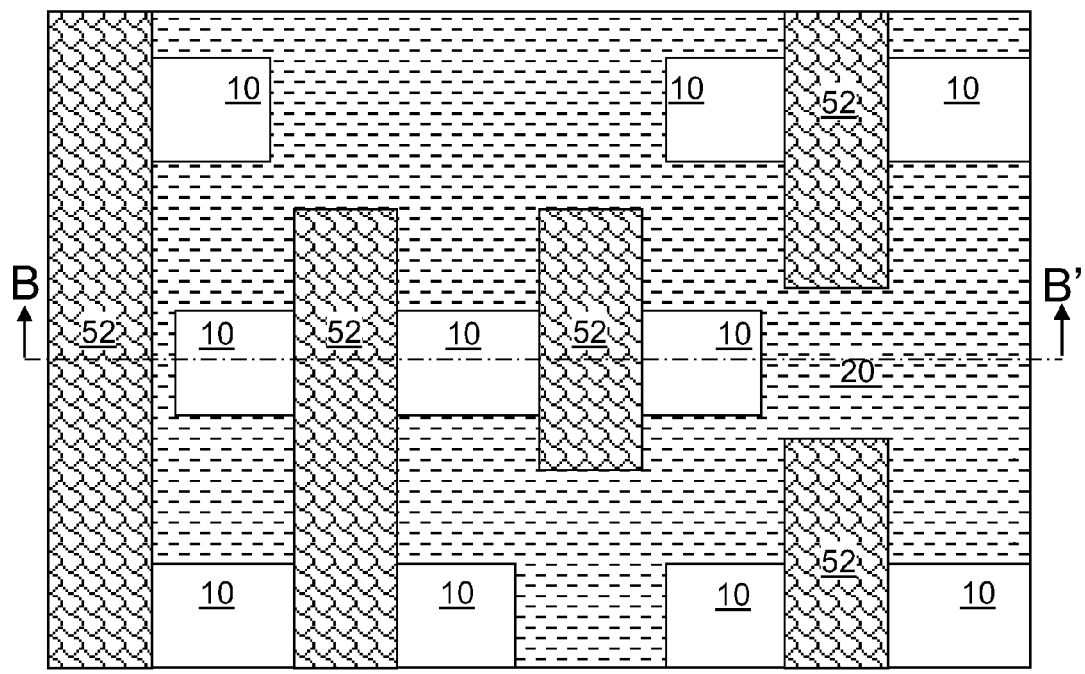
FIGS. 4A and 4B are views of the exemplary semiconductor structure after removal of a photoresist layer employed for the optional additional patterning of the disposable gate structures according to an embodiment of the present disclosure.
Figure 4B:
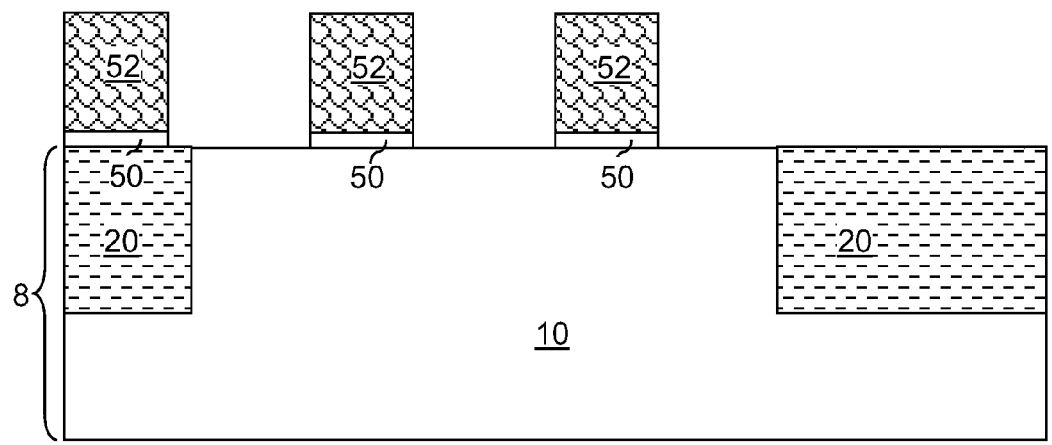

Referring to FIGS. 4A and 4B, the patterned photoresist 59 is subsequently removed, for example, by ashing. While an embodiment employing two separate sets of lithographic processing steps is illustrated herein, an embodiment in which a single photoresist is employed to form patterned disposable gate structures (50, 52) of FIGS. 4A and 4B can also be employed.

Figure 5A:
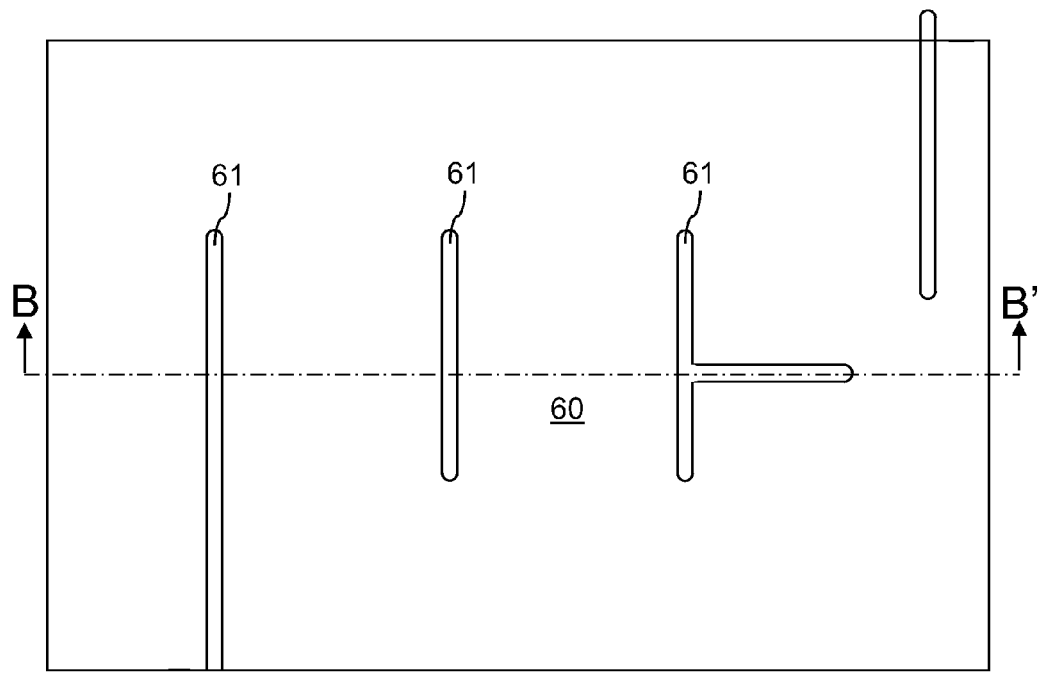
FIGS. 5A and 5B are views of the exemplary semiconductor structure after deposition of a planarization dielectric layer over the disposable gate structures according to an embodiment of the present disclosure.
Figure 5B:
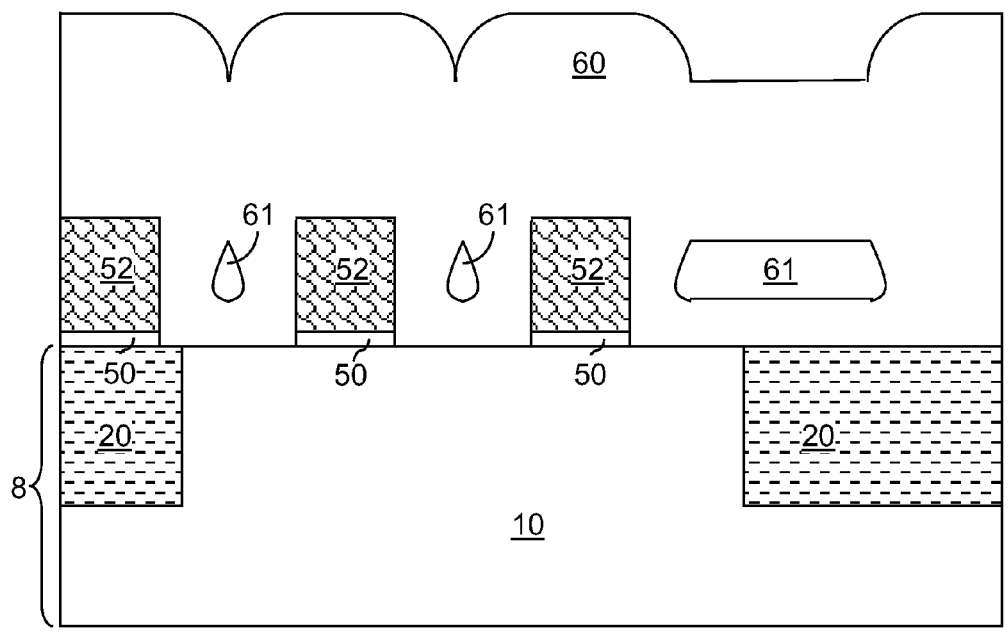

Referring to FIGS. 5A and 5B, a planarization dielectric layer 60 is deposited over the disposable gate structures (50, 52) by a deposition process such as low pressure chemical vapor deposition (CVD), plasma enhanced chemical vapor deposition (PECVD), high density plasma chemical vapor deposition (HDPCVD), rapid thermal chemical vapor deposition (RTCVD), subatmospheric chemical vapor deposition (SACVD), or any other deposition method that is vulnerable to keyhole formation due to the topology of underlying structures.

Due a greater deposition rate of a material on horizontal surfaces relative to deposition rate on vertical surfaces, or corners, a cavity is formed in areas where the aspect ratio of a space between a neighboring pair of protruding structures exceeds a maximum aspect ratio that the deposition process is capable of providing a gap-free fill. The maximum aspect ratio is a function of the height of, and the lateral spacing between, the protruding structures, the conformity of the deposition process employed to form the planarization dielectric layer 60, and the viscosity of the material of the planarization dielectric layer 60.

In a vertical cross-sectional view perpendicular to the lengthwise directions of a pair of parallel protruding structures, the cross-sectional shape of the cavity can be a keyhole, i.e., a shape that has vertically increasing lateral dimensions from the bottommost portion to a first height and vertically decreasing lateral dimensions from the first height to a second height that is greater than the first height and is about the height of the protruding structures. Thus, the cavities formed in the planarization dielectric layer 60 are referred to gap-fill keyholes 61, i.e., keyhole-shaped cavities that are formed by a failure to completely fill a gap between adjacent protruding structures. The gap-fill keyholes 61 can run in a direction parallel to sidewalls of a neighboring pair of protruding structures if the protruding structures are parallel to each other and are spaced by less than the minimum dimension.

The material of the planarization dielectric layer 60 is herein referred to a first dielectric material, which can be, but is not limited to, silicon oxide, silicon nitride, silicon oxynitride, phosphosilicate glass (PSG), fluorosilicate glass (FSG), borophosphosilicate glass (BPSG), borosilicate glass (BSG), and a combination thereof. In one embodiment, the first dielectric material does not include carbon.

In one embodiment, the protruding structures include disposable gate structures (50, 52). In one embodiment, a neighboring pair of the disposable gate structures (50, 52) can be parallel to each other so that one of the pair of the disposable gate structures (50, 52) has a sidewall that is parallel to another sidewall of the other of the pair of the disposable gate structures (50, 52), and a lengthwise direction of a gap-fill keyhole 61 therebetween is parallel to the two sidewalls.

In one embodiment, the thickness of the planarization dielectric layer 60 is selected so that all planar top surfaces of the planarization dielectric layer 60 outside the gap-fill keyholes 61 are above the topmost surfaces of the protruding structures such as the disposable gate structures (50, 52).

Figure 6A:
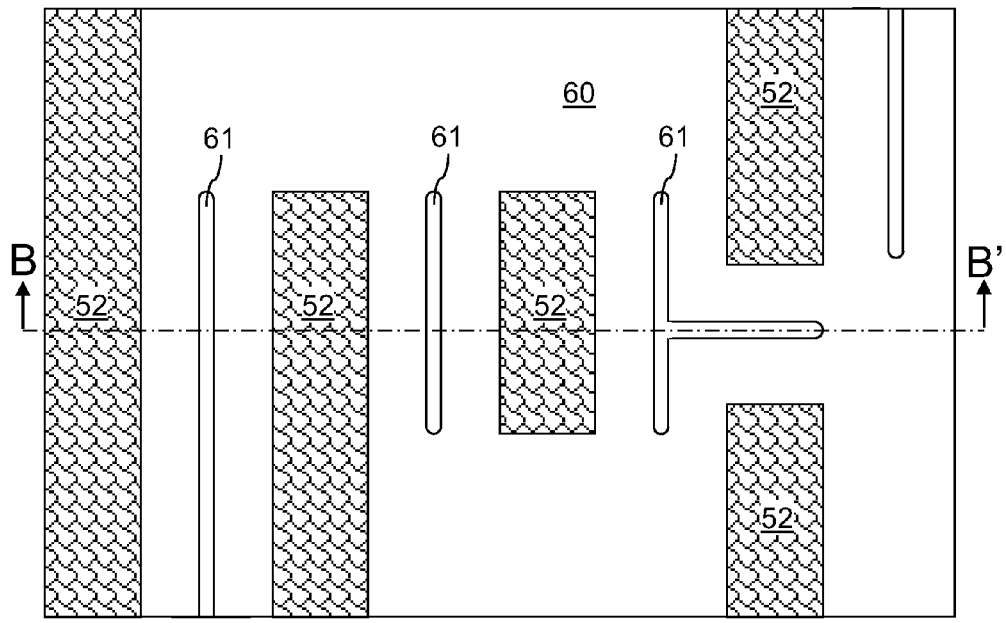
FIGS. 6A and 6B are views of the exemplary semiconductor structure after planarization of the planarization dielectric layer according to an embodiment of the present disclosure.
Figure 6B:
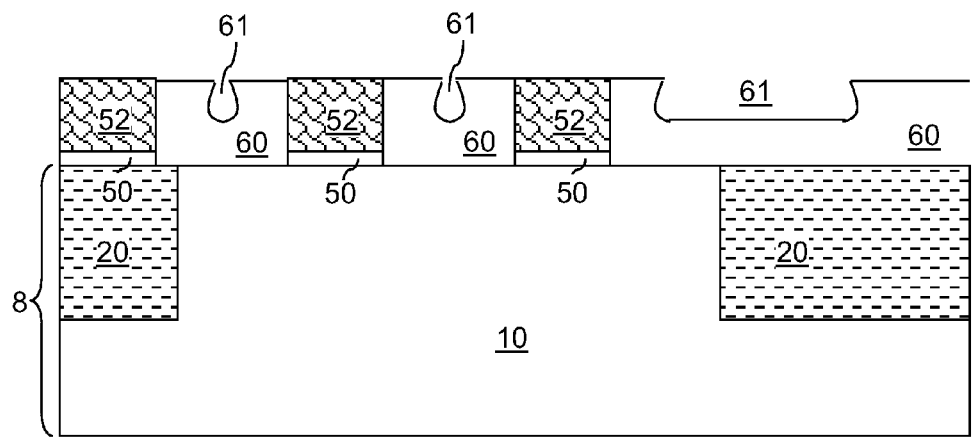

Referring to FIGS. 6A and 6B, the planarization dielectric layer 60 is planarized to provide a planar top surface that extends throughout the entirety of the planar dielectric layer 60. For example, chemical mechanical planarization (CMP) can be employed in which the top surfaces of the protruding structures are employed as a stopping layer. The planarization dielectric layer 60 is present between neighboring pairs of the protruding structures. If a neighboring pair of protruding structures is laterally spaced by a dimension less than the minimum dimension discussed above, a gap-fill keyhole 61 is present between the neighboring pair of protruding structures.

Figure 7A:
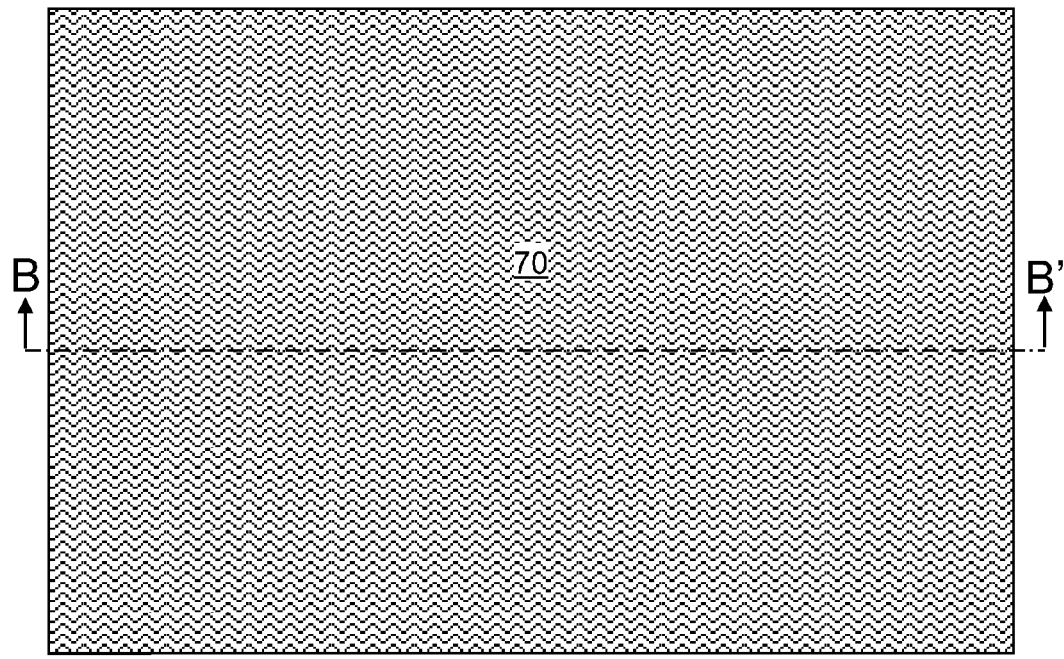
FIGS. 7A and 7B are views of the exemplary semiconductor structure after formation of a printable dielectric material layer according to an embodiment of the present disclosure.
Figure 7B:
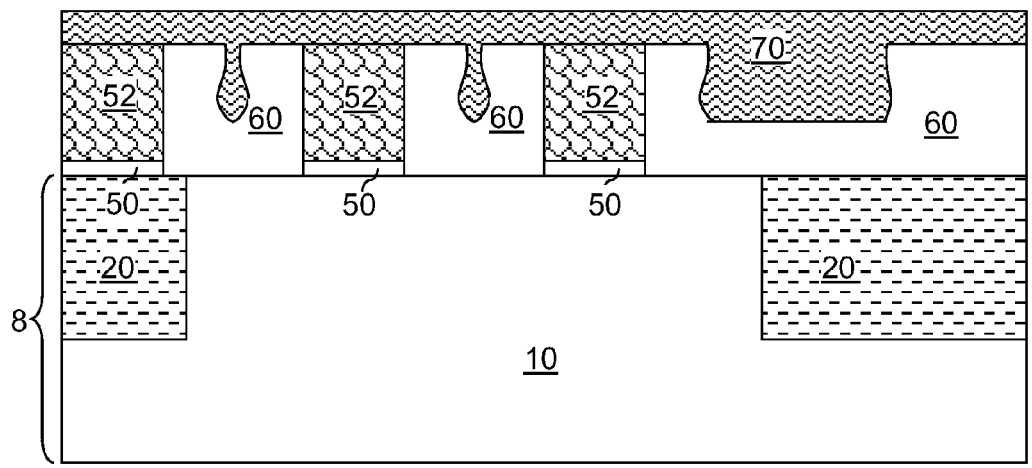

Referring to FIGS. 7A and 7B, a printable dielectric material layer 70 is formed over the planarization dielectric layer 60. As used herein, a "printable dielectric material" refers to a class of materials which can be coated as a self-planarizing material layer, and subsequently cross-linked into a dielectric material using a lithographic process. Thus, the printable dielectric material can be a polymer having light-sensitive unlinked crosslinkable bonds that become crosslinked during the lithographic exposure. The lithographic process can be, for example, 193 nm photolithography, extreme UV lithography (EUV), or electron beam lithography. Exemplary printable dielectric materials include, but are not limited to, hydrogen silsesquioxane (HSQ) and HSQ-based materials, which are cross-linked into $SiO_2$ under electron beam or EUV exposure, and methyl silsesquioxane (MSQ) and MSQ-based materials which are cross-linked into organosilicate glass (OSG) including Si, C, O, and H by 193 nm photolithography or EUV lithography. Organosilicate glass is also referred to as a SiCOH dielectric.

The printable dielectric material layer 70 can be formed, for example, by applying a printable dielectric material employing spin coating. The viscosity of the printable dielectric material is low enough to enable flow of the printable dielectric material into the gap-fill keyholes 61 and to fill the gap-fill keyholes 61. The printable dielectric material layer 70 is formed to have a top surface above a topmost surface of the planarization dielectric layer 60. The dielectric material of the printable dielectric material layer 70 is herein referred to as a second dielectric material.

In one embodiment, the printable dielectric material layer 70 includes a precursor to an organosilicate glass (OSG). The precursor includes each of silicon, oxygen, carbon, and hydrogen at an atomic concentration greater than 1%, and is transformed into the OSG upon lithographic exposure.

In one embodiment, the first dielectric material of the planarization dielectric layer 60 does not include carbon, and the second dielectric material of the printable dielectric material layer includes carbon.

Figure 8A:
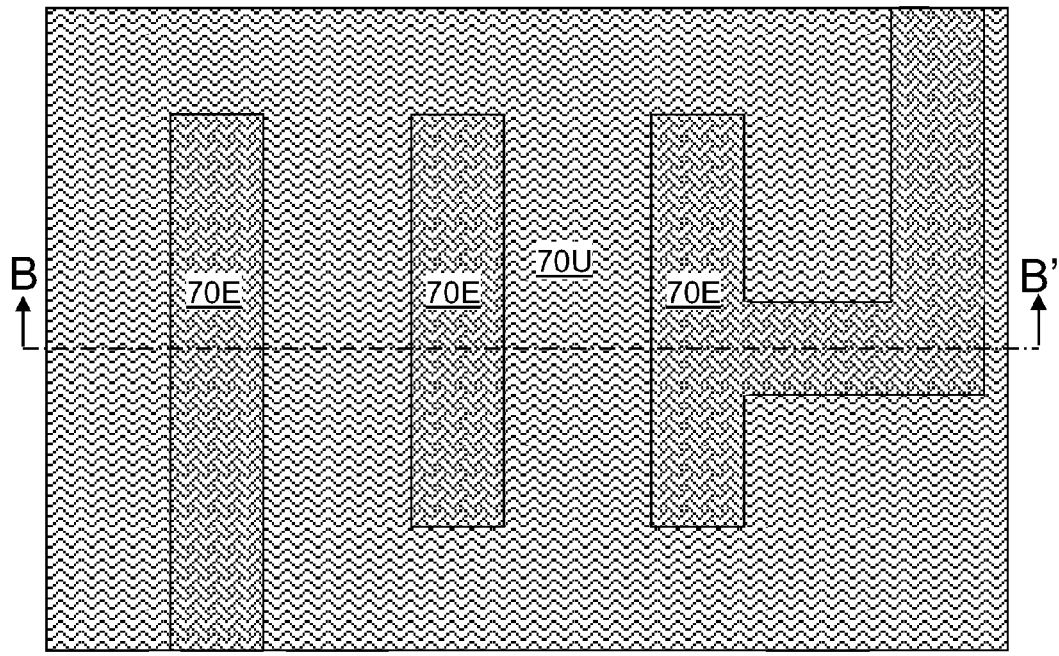
FIGS. 8A and 8B are views of the exemplary semiconductor structure after lithographic exposure of the printable dielectric material layer according to an embodiment of the present disclosure.
Figure 8B:
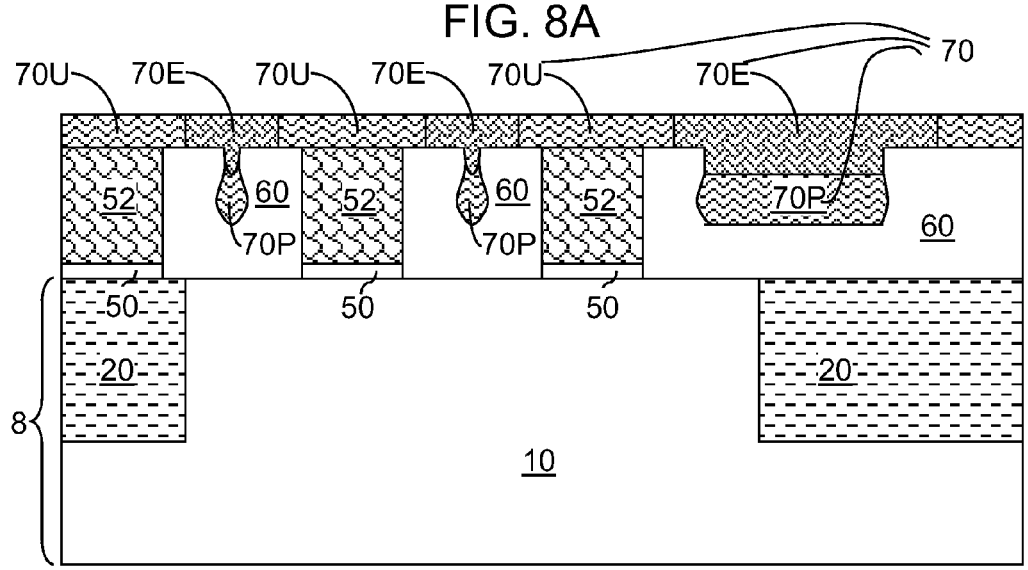

Referring to FIGS. 8A and 8B, the printable dielectric material layer 70 is lithographically exposed. Specifically, portions of the printable dielectric material layer 70 are lithographically exposed with radiation, which can be electromagnetic radiation or radiation with electron beams. The lithographically exposed portions of the printable dielectric material layer 70 are located in and above the gap-fill keyholes 61 (See FIGS. 6A and 6B) that are filled with the printable dielectric material. Crosslinked printable dielectric material portions 70E are formed at least within upper portions of the gap-fill keyholes 61 and above gap-fill keyholes 61.

Portions of the printable dielectric material layer 70 overlying the protruding structures (such as disposable gate structures (50, 52)) are not exposed to radiation during the lithographic exposure, and are herein referred to as first non-crosslinked printable dielectric material portions 70U. Portions of the printable dielectric material layer 70 overlying the gap-fill keyhole 61 are exposed to radiation during the lithographic exposure to become parts of the crosslinked printable dielectric material portions 70E.

In one embodiment, the intensity of the exposed radiation may be adjusted so that the printable dielectric material layer in lower portions of the gap-fill keyholes 61 is not crosslinked during the lithographic exposure process. In each gap-fill keyhole 61, an upper portion of the gap-fill keyhole 61 can be filled with a crosslinked printable dielectric material portion 70E after the lithographic exposure, and a lower portion of the gap-fill keyhole 61 can be filled with a second non-crosslinked printable dielectric material portion 70P after the lithographic exposure. The first non-crosslinked printable dielectric material portions 70U and the second non-crosslinked printable dielectric material portions 70P include a non-crosslinked printable dielectric material that is the same as the material of the printable dielectric material layer 70 as originally applied.

Figure 9A:
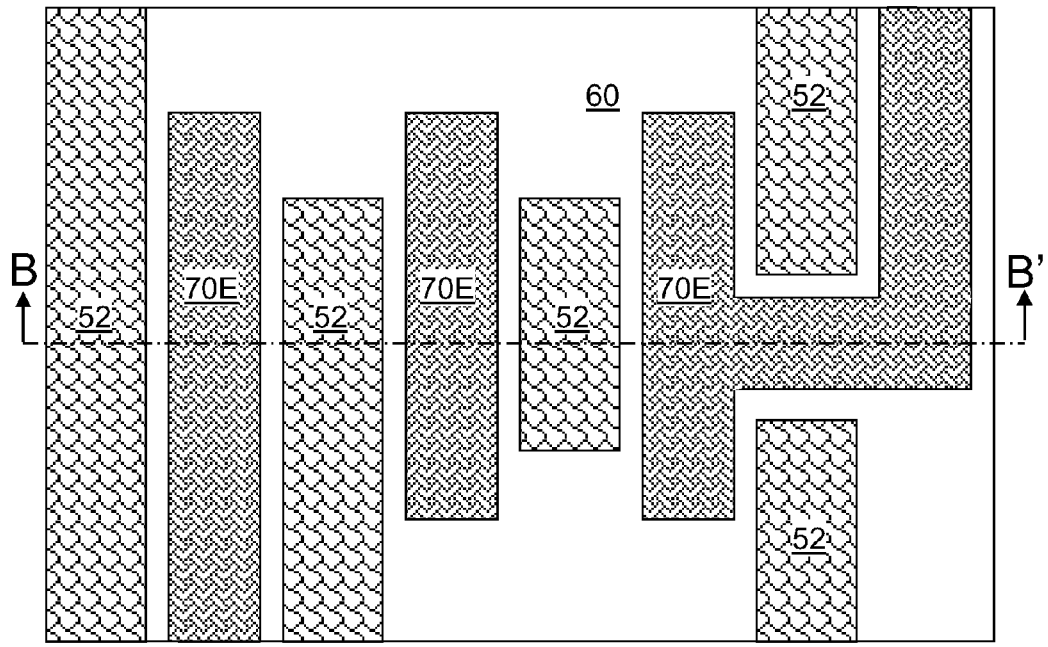
FIGS. 9A and 9B are views of the exemplary semiconductor structure after development of the exposed printable dielectric material layer according to an embodiment of the present disclosure.
Figure 9B:
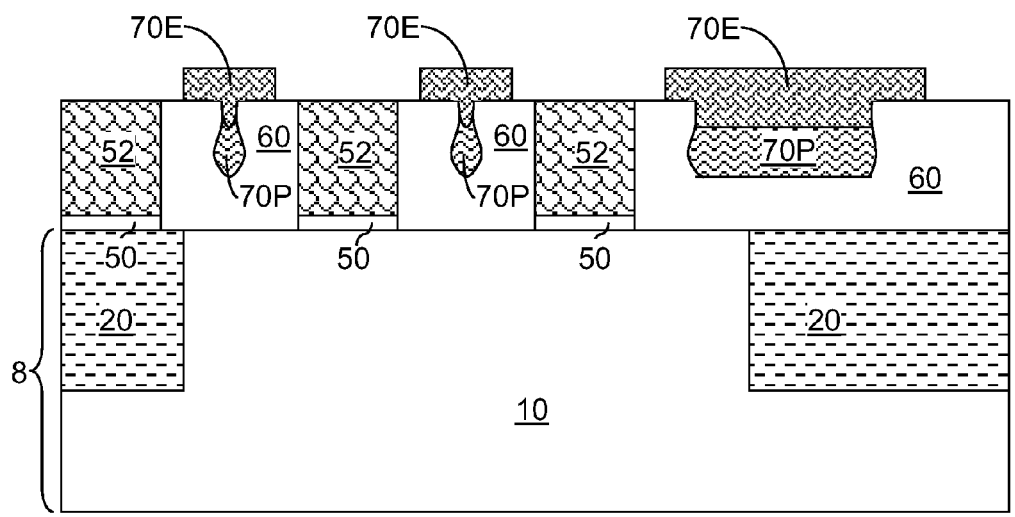

Referring to FIGS. 9A and 9B, the exposed printable dielectric material layer (70E, 70U, 70P) is developed to remove non-crosslinked portions of the printable dielectric material layer (70E, 70U, 70P) from above the topmost surface of the planarization dielectric layer 60. Thus, the first non-crosslinked printable dielectric material portions 70U are removed during development, while the crosslinked printable dielectric material portions 70E are not removed. Further, because the second non-crosslinked printable dielectric material portions 70P are protected from a developer solution by the overlying crosslinked printable dielectric material portions 70E, and the second non-crosslinked printable dielectric material portions 70P are not removed during the development.

Figure 10A:
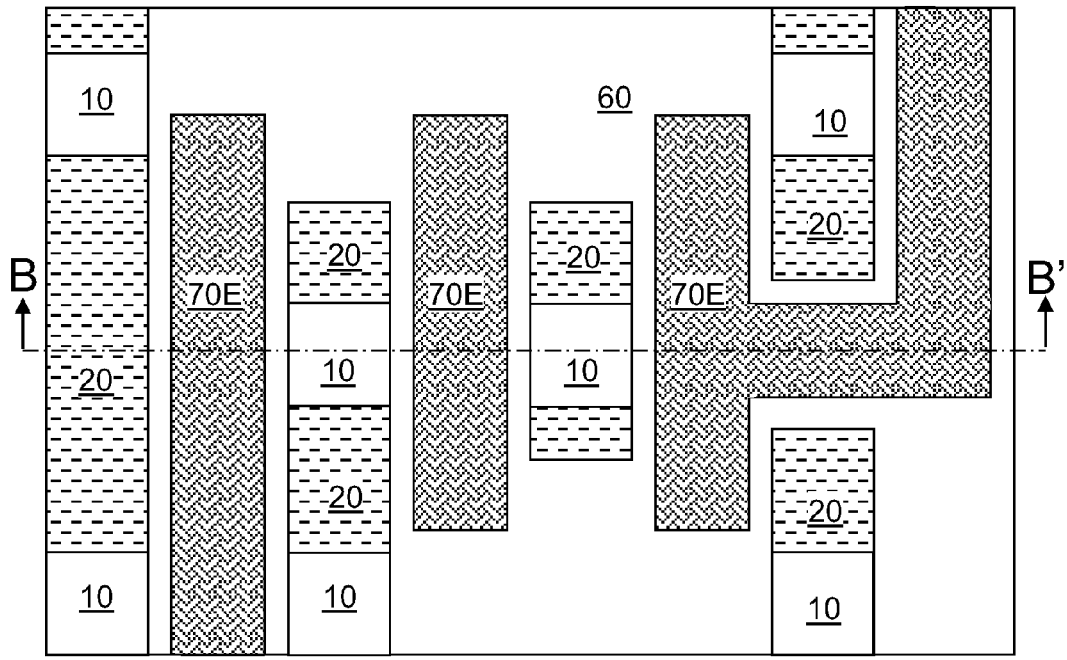
FIGS. 10A and 10B are views of the exemplary semiconductor structure after removal of the disposable gate structures according to an embodiment of the present disclosure.
Figure 10B:
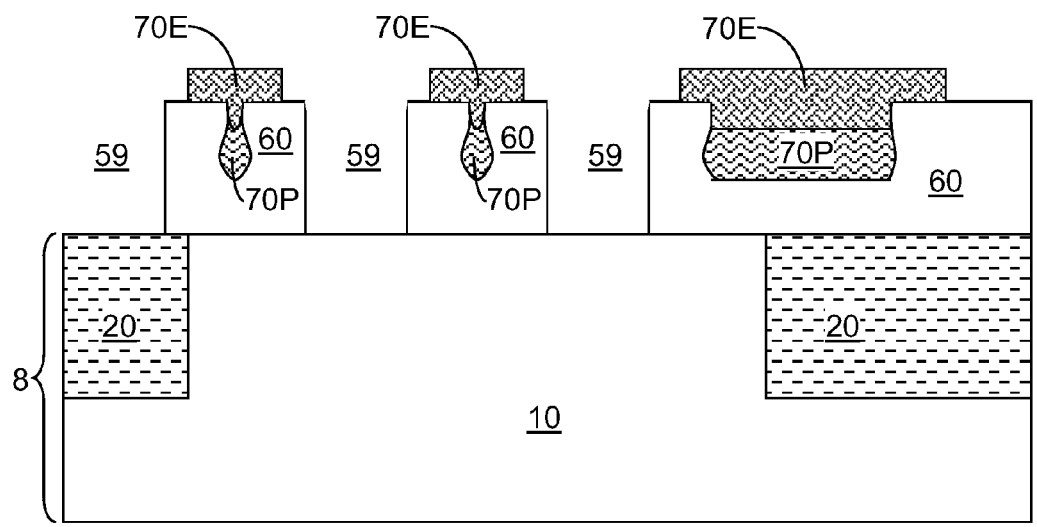

Referring to FIGS. 10A and 10B, the protruding structures can be removed. For example, if the protruding structures are disposable gate structures (50, 52), the disposable gate structures (50, 52) can be removed while the planarization dielectric layer 60, the semiconductor region 10, and the crosslinked printable dielectric material portions 70E are not removed by a substantial amount. The gate dielectric 50 may be removed, or may remain in place.

At least one isotropic etch and/or at least one anisotropic etch can be employed to remove the materials of the disposable gate structures (50, 52) selective to the materials of the planarization dielectric layer 60, the semiconductor region 10, and the crosslinked printable dielectric material portions 70E. In a non-limiting illustrative example, if the disposable gate material portion 52 includes germanium at an atomic concentration greater than 10%, hydrogen peroxide can be employed to remove the disposable gate material portion 52 selective to the planarization dielectric layer 60. The disposable gate dielectrics 50 can be removed, for example, by a wet etch.

Gate cavities 59 are formed in the volume from which the disposable gate structures (50, 52) are removed. Semiconductor surfaces of the semiconductor region 10 and/or dielectric surfaces of the shallow trench isolation structures 20 can be exposed at the bottom of each gate cavity 59.

Figure 11A:
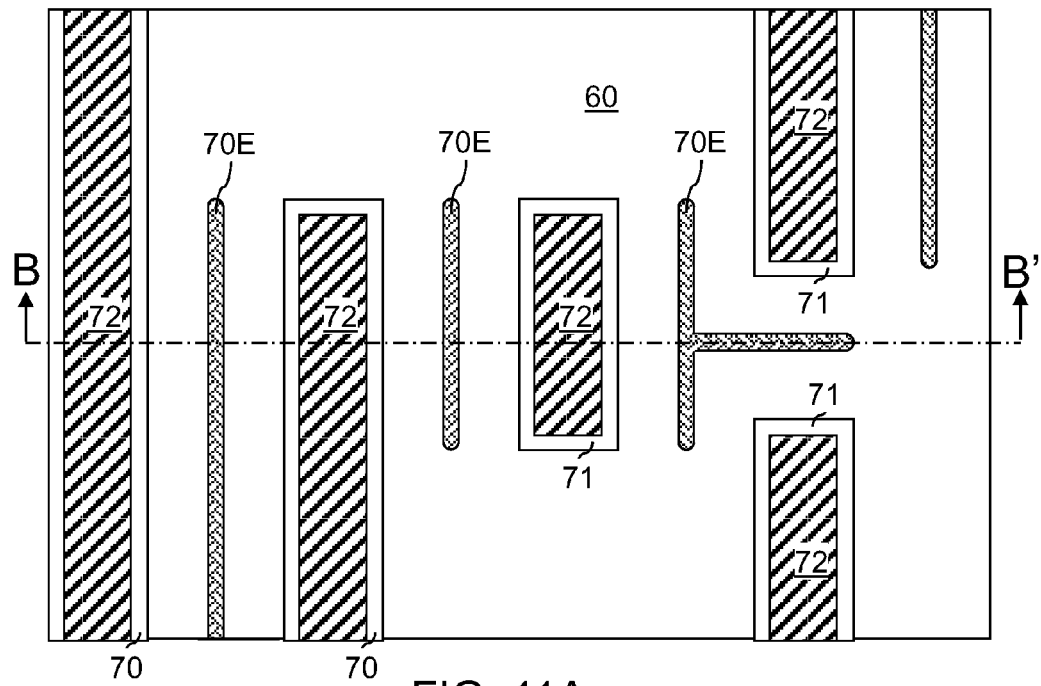
FIGS. 11A and 11B are views of the exemplary semiconductor structure after formation of replacement gate structures according to an embodiment of the present disclosure.
Figure 11B:
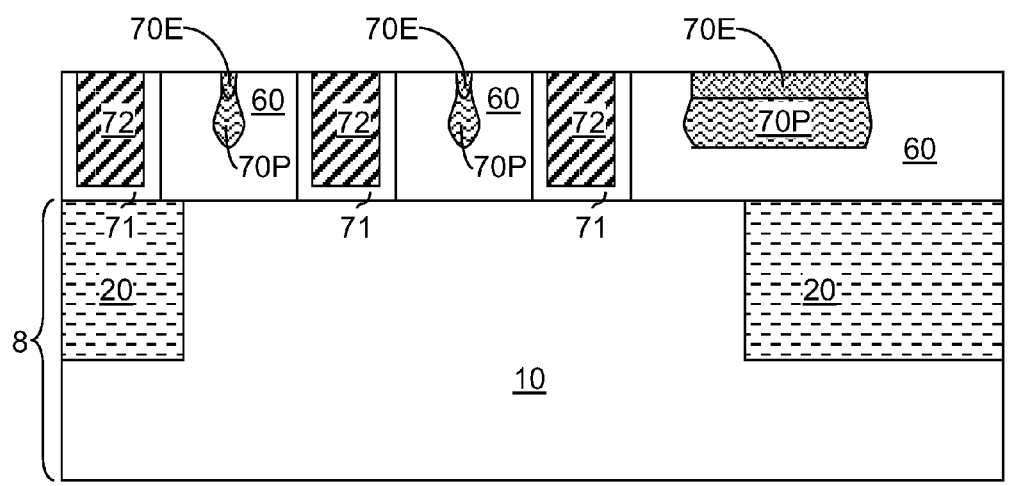

Referring to FIGS. 11A and 11B, replacement gate structures are formed in the gate cavities 59. The replacement gate structures are gate structures that replace the disposable gate structures (50, 52). The replacement gate structures can be formed by depositing a replacement gate dielectric layer and a replacement conductive material layer in the gate cavities 59. If the gate dielectric layer 50 is not removed, then a replacement gate dielectric layer 71 may be omitted in this step. After deposition of the replacement conductive material layer, portions of the replacement gate dielectric layer and the replacement conductive material layer that protrude above the topmost surface of the planarization dielectric layer 60. Each remaining portion of the replacement gate dielectric layer constitutes a U-shaped gate dielectric 71, and each remaining portion of the replacement conductive material layer constitutes a gate electrode 72. A combination of a U-shaped gate dielectric 71 and a gate electrode 72 thereupon constitute a replacement gate structure (71, 72).

The replacement gate dielectric layer and the U-shaped gate dielectrics 71 include a dielectric material, which can be silicon oxide, silicon nitride, silicon oxynitride, or a stack thereof. Alternately or additionally, the replacement gate dielectric layer and the U-shaped gate dielectrics 71 can include a high dielectric constant (high-k) material layer having a dielectric constant greater than 8.0. In one embodiment, the U-shaped gate dielectrics 71 can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y2O_xN_y$, a silicate thereof, and an alloy thereof. Each value of x is independently from 0.5 to 3 and each value of y is independently from 0 to 2. The thickness of the U-shaped gate dielectrics 71, as measured at a horizontal portion directly above the top surface of the semiconductor region 10, can be from 0.9 nm to 6 nm, and preferably from 1.0 nm to 3 nm, although lesser and greater thicknesses can also be employed.

The replacement conductive material layer and the gate electrodes 71 include a conductive material, which can be a doped semiconductor material, a metallic material, or a combination thereof. The doped semiconductor material, if present, can be doped polysilicon, doped polycrystalline germanium, a doped silicon-germanium alloy, any other doped elemental or compound semiconductor material, or a combination thereof. The metallic material, if present, can be any metallic material that can be deposited by chemical vapor deposition (CVD), physical vapor deposition (PVD), or a combination thereof. For example, the metallic material can include aluminum and/or tungsten.

The top surfaces of each of the replacement gate structures (71, 72) can be coplanar with the planar top surface of the planarization dielectric layer 60. Filled gap-fill keyholes, i.e., gap-fill keyholes that are filled, are embedded in the planarization dielectric layer 60. Each filled gap-fill keyholes can include a crosslinked printable dielectric material portion 71E having a top surface that is coplanar with the planar top surface of the planarization dielectric layer 60 located at an upper portion thereof, and a second non-crosslinked printable dielectric material portions 70P located at a lower portion thereof.

A pair of neighboring replacement gate structures (71, 72) can include a first replacement gate structure (71, 72) and a second replacement gate structure (71, 72) that are parallel to each other. If the first replacement gate structure (71, 72) and a second replacement gate structure (71, 72) are laterally spaced by less than the minimum dimension discussed above, a filled gap-fill keyhole (70E, 70P) can be present between the pair of neighboring replacement gate structures (71, 72) so that the lengthwise direction of the filled gap-fill keyhole (70E, 70P) is parallel to the sidewalls of the pair of neighboring replacement gate structures (71, 72).

Figure 12A:
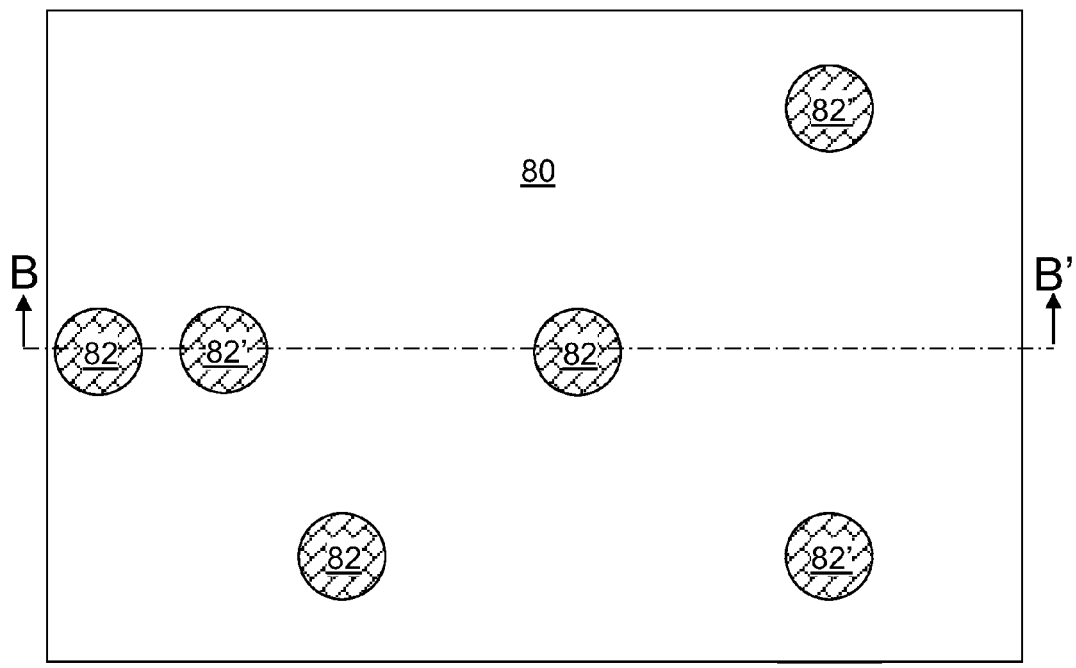
FIGS. 12A and 12B are view of the exemplary semiconductor structure after formation of a contact-level dielectric layer and contact via structures according to an embodiment of the present disclosure.
Figure 12B:
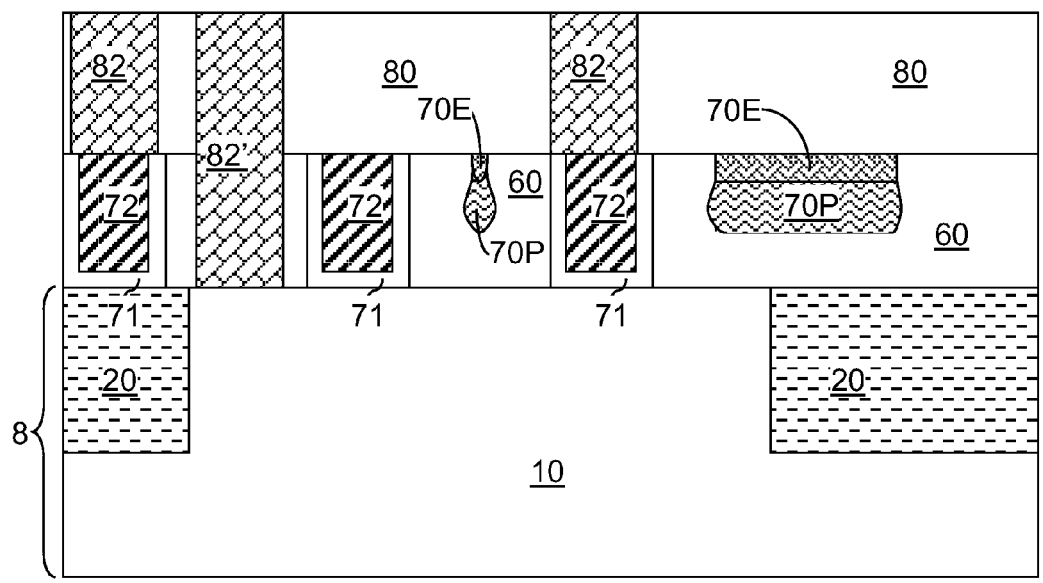

Referring to FIGS. 12A and 12B, a contact-level dielectric layer 80 and contact via structures (82, 82') are formed above the planarization dielectric layer 60. The contact-level dielectric layer 80 can include any material that can be employed as a dielectric material in metal interconnect structures. For example, the contact-level dielectric layer 80 can include doped or undoped silicate glass, silicon nitride, organosilicate glass, or a combination thereof. The contact via structures (82, 82) include various types of conductive via structures that provide a conductive path to various semiconductor elements in the semiconductor region 10 and the gate electrodes 72.

Figure 13A:
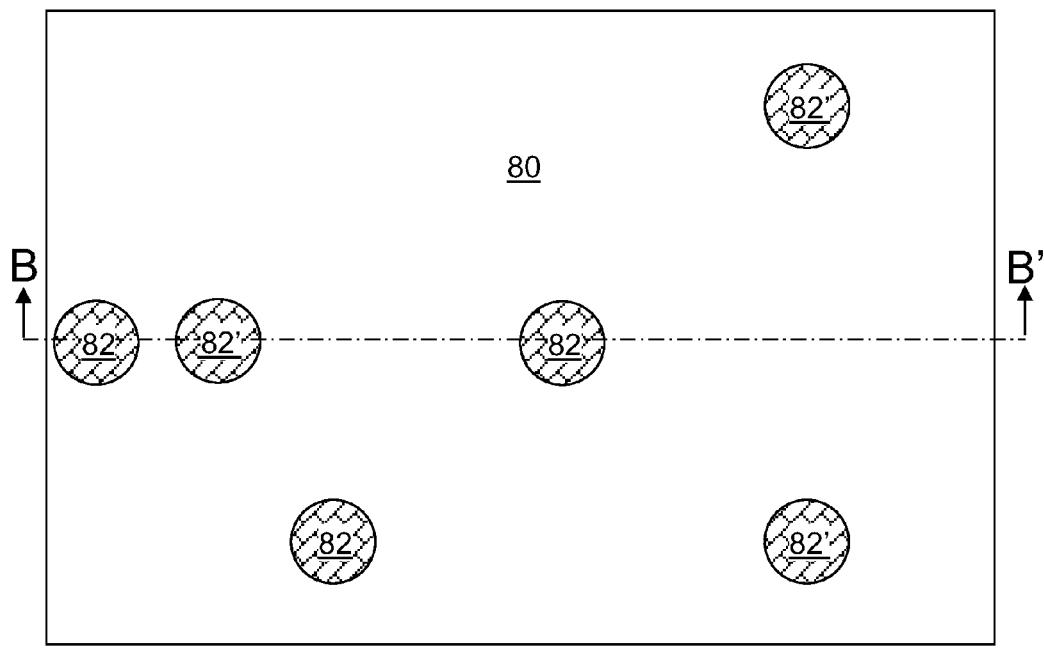
FIGS. 13A and 13B are views of a variation of the exemplary semiconductor structure according to an embodiment of the present disclosure.
Figure 13B:
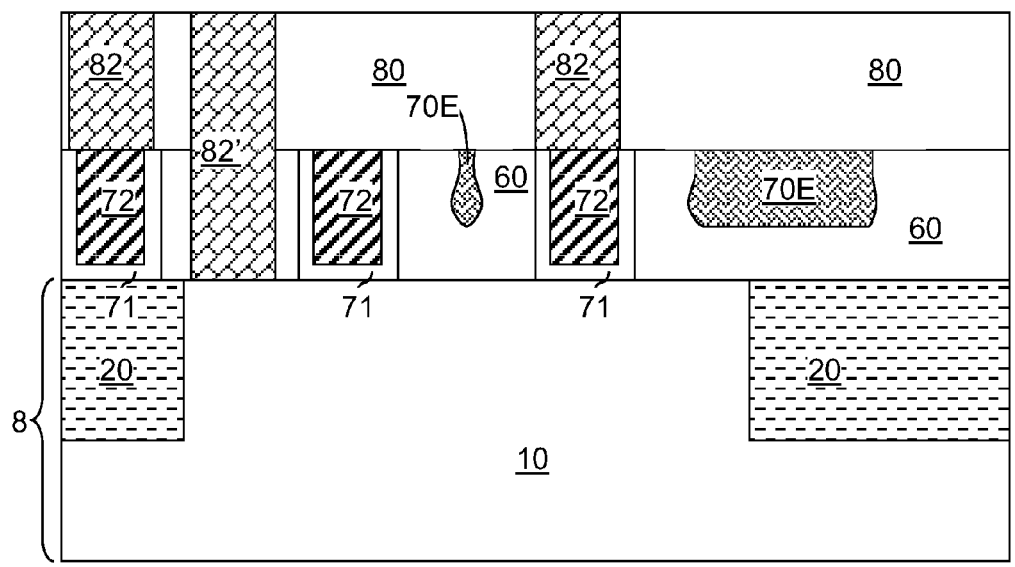

Referring to FIGS. 13A and 13B, a variation of the exemplary semiconductor structure can be derived from the exemplary semiconductor structure by selecting the intensity of irradiation during the lithographic exposure of the printable dielectric material layer 70 so that the entirety of the gap-fill keyholes 61 is filled with the crosslinked printable dielectric material portion after the lithographic exposure. Thus, the extent of the crosslinked printable dielectric material portions 70E extends to the bottom of the gap-fill keyholes 61, and the volume of the second non-crosslinked printable dielectric material portions 70P shrink to zero as the dose of irradiation increases during the lithographic exposure step corresponding to FIGS. 8A and 8B. In this case, the crosslinked printable dielectric material portions 70E alone replaces the combination of the crosslinked printable dielectric material portions 70E and the second non-crosslinked printable dielectric material portions 70P as illustrated in FIGS. 9A, 9B, 10A, 10B, 11A, 11B, 12A, and 12B to provide the variation of the exemplary semiconductor structure illustrated in FIGS. 13A and 13B.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a structure comprising:
    forming protruding structures over a top surface of a substrate;
    forming a dielectric layer including a gap-fill keyhole on said substrate, wherein said dielectric layer is present between neighboring pairs of said protruding structures;
    applying a printable dielectric material layer over said dielectric layer, said printable dielectric material layer filling said gap-fill keyhole;
    lithographically exposing a portion of said printable dielectric material layer with radiation, wherein a crosslinked printable dielectric material portion is formed at least within an upper portion of said gap-fill keyhole; and
    removing non-crosslinked portions of said printable dielectric material layer from above said dielectric layer.

2. The method of claim 1, wherein said protruding structures are disposable gate structures, and said method further comprises:
    removing said disposable gate structures selective to said dielectric layer to form gate cavities; and
    forming gate structures within said gate cavities by depositing at least one dielectric material and at least one conductive material.

3. The method of claim 2, wherein each of said gate structures include a U-shaped gate dielectric and a gate electrode.

4. The method of claim 3, wherein a top surface of each of said gate structures is coplanar with a top surface of said dielectric layer.

5. The method of claim 1, wherein said printable dielectric material layer is a self-planarizing material and has a top surface above a topmost surface of said dielectric layer.

6. The method of claim 1, wherein said printable dielectric material layer includes a polymer having light-sensitive unlinked crosslinkable bonds that become crosslinked during said lithographic exposure.

7. The method of claim 1, wherein portions of said printable dielectric material layer overlying said protruding structures are not exposed to radiation during said lithographic exposure, and a portion of said printable dielectric material layer overlying said gap-fill keyhole are exposed to radiation during said lithographic exposure.

8. The method of claim 1, wherein an entirety of said gap-fill keyhole is filled with said crosslinked printable dielectric material portion after said lithographic exposure.

9. The method of claim 1, wherein a lower portion of said gap-fill keyhole is filled with a non-crosslinked printable dielectric material after said lithographic exposure.

10. The method of claim 9, wherein said printable dielectric material layer includes a material selected from hydrogen silsesquioxane (HSQ) and methyl silsesquioxane (MSQ).

* * * * *